(12) United States Patent
Hess et al.

(10) Patent No.: US 7,241,636 B2
(45) Date of Patent: Jul. 10, 2007

(54) METHOD AND APPARATUS FOR PROVIDING STRUCTURAL SUPPORT FOR INTERCONNECT PAD WHILE ALLOWING SIGNAL CONDUCTANCE

(75) Inventors: Kevin J. Hess, Austin, TX (US); Susan H. Downey, Austin, TX (US); James W. Miller, Austin, TX (US); Cheng Choi Yong, Kuala Lumpur (MY)

(73) Assignee: Freescale Semiconductor, Inc., Austin, TX (US)

( * ) Notice: Subject to any disclaimer, the term of this patent is extended or adjusted under 35 U.S.C. 154(b) by 297 days.

(21) Appl. No.: 11/033,008

(22) Filed: Jan. 11, 2005

(65) Prior Publication Data

US 2006/0154469 A1    Jul. 13, 2006

(51) Int. Cl.
*G01R 31/26* (2006.01)
*H01L 21/66* (2006.01)

(52) U.S. Cl. .................... 438/14; 257/E21.525

(58) Field of Classification Search ............ 438/14–17, 438/612; 700/57
See application file for complete search history.

(56) References Cited

U.S. PATENT DOCUMENTS

| | | | |
|---|---|---|---|
| 5,149,674 A | 9/1992 | Freeman, Jr. et al. | |
| 5,514,892 A | 5/1996 | Countryman et al. | |
| 5,751,065 A | 5/1998 | Chittipeddi et al. | |
| 5,923,088 A | 7/1999 | Shiue et al. | |
| 6,144,100 A | 11/2000 | Shen et al. | |
| 6,187,658 B1 | 2/2001 | Chittipeddi et al. | |
| 6,232,662 B1 | 5/2001 | Saran | |
| 6,365,958 B1 | 4/2002 | Ibnabdeljalil et al. | |
| 6,384,486 B2 | 5/2002 | Zuniga et al. | |
| 6,614,091 B1 | 9/2003 | Downey et al. | |
| 6,675,053 B2 * | 1/2004 | Baluswamy et al. ........... 700/58 |
| 6,765,282 B2 * | 7/2004 | Schulz ........................ 257/629 |
| 6,791,196 B2 * | 9/2004 | Kwon et al. ................. 257/784 |
| 6,804,808 B2 * | 10/2004 | Li et al. ......................... 716/5 |
| 7,081,679 B2 * | 7/2006 | Huang et al. ................ 257/779 |
| 2002/0025417 A1 | 2/2002 | Chisholm et al. | |
| 2003/0020163 A1 | 1/2003 | Hung et al. | |
| 2005/0082577 A1 | 4/2005 | Usui | |
| 2006/0281200 A1 * | 12/2006 | Cadouri ......................... 438/14 |

OTHER PUBLICATIONS

Wintgens, Carl; "Detailed Structural Analysis I of the Oki Electric Co. Ltd. L67Q4003 32-Bit Microcontroller with Optional Analyses"; Sep. 2004.

* cited by examiner

*Primary Examiner*—David A. Zarneke
(74) *Attorney, Agent, or Firm*—Robert L. King; Susan C. Hill (57) ABSTRACT

A method provides an interconnect structure having enhanced structural support when underlying functional metal layers are insulated with a low modulus dielectric. A first metal layer having a plurality of openings overlies the substrate. A first electrically insulating layer overlies the first metal layer. A second metal layer overlies the first electrically insulating layer, the second metal layer having a plurality of openings. An interconnect pad that defines an interconnect pad area overlies the second metal layer. At least a certain amount of the openings in the two metal layers are aligned to improve structural strength of the interconnect structure. The amount of alignment may differ depending upon the application and materials used. A bond wire connection or conductive bump may be used with the interconnect structure.

20 Claims, 7 Drawing Sheets

METHOD AND APPARATUS FOR PROVIDING STRUCTURAL SUPPORT FOR INTERCONNECT PAD WHILE ALLOWING SIGNAL CONDUCTANCE

CROSS REFERENCE TO RELATED APPLICATION

This application is related to copending U.S. patent application Ser. No. 11/033,009 entitled "Integrated Circuit Having Structural Support For A Flip-Flop Interconnect Pad and Method Therefor" filed simultaneously herewith by Scott Pozder et al. and assigned to the assignee hereof.

FIELD OF THE INVENTION

This disclosure relates to packaged semiconductors and more particularly to interconnect pads of integrated circuits for making electrical connection to underlying conductive layers.

RELATED ART

Wire bonding is a widely used method to connect a semiconductor die having electrical circuitry to a pin on a component package. As geometries in semiconductors continue to shrink in size due to improvements in the technology for making semiconductors, the sizes of wire bond pad regions have become smaller. A smaller bond pad region results in increased stress to the bond pad structure when a physical wire bond connection is made to the integrated circuit. The bond pad structure, which includes the metal bond pad itself and the underlying stack of metal interconnect and dielectric layers, mechanically supports the pad during wire bonding. While the development of advanced low permittivity (low-k) dielectric materials has had a positive impact on integrated circuit electrical performance, these low-k materials typically exhibit a low modulus which reduces the strength of the bond pad structure. In particular, bond pad structures fabricated with copper interconnect metallization and low modulus (low-k) dielectrics are susceptible to mechanical damage during the wire bonding process. Because the advanced low-k interlayer dielectrics used today have a lower modulus than dielectrics used in earlier generation products, wire bonding may more easily mechanically fracture the underlying stack of metal and dielectric layers.

Additional to the compressive forces that may cause mechanical and structural failures, a lifting force associated with the tensioning of the bonded wire during movement of the wirebonding capillary after mechanical bonding may also cause structural damage to a wire bond. The lifting force tends to cause delamination of one or more underlying layers. Such structural damage may be visually undetectable and not become apparent until subsequent testing or operation.

A known method to address the mechanical stress present underlying a wire bond is to use a dedicated support structure. A common structure is the use of at least two metal layers under the bonding pad that are connected together and to the bonding pad by large arrays of vias distributed across a majority of the wire bond pad area. This via arrangement requires that majority portions of the underlying metal layers and the bonding pad are all electrically connected together and thus are not functionally independent of each other. Therefore, under the wire bond pad, these majority portions of the underlying two metal layers may not be used for wiring or interconnects unrelated to the pad. What is needed is a bond pad structure that incorporates low modulus dielectric materials but still provides robust support for wire bonding and allows the majority of the two metal layers underlying the bonding pad to be used for wiring unrelated to the pad.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally there is herein provided a method and apparatus for providing structural support for interconnect pad locations in an integrated circuit (IC) by using novel layout techniques in the metallization and dielectric stack underlying the pad. As used herein, an interconnect pad, formed of metal, is placed at the surface of an integrated circuit where an electrical connection is made from the pad to one or more underlying metal layers. In a typical IC design, multiple metal layers separated by interlevel dielectrics are formed in a stack to provide the required interconnections between devices in the semiconductor substrate. Examples of an interconnect pad include, but are not limited to, a wire bond pad, a probe pad, a flip-chip bump pad, a test point or other packaging or test pad structures that may require underlying structural support. The interconnect pad region, located physically underneath the interconnect pad, defines the region in which the layout techniques provided herein may be applied. With these layout techniques, bond pad structures fabricated in IC technologies with copper interconnect metallization and low modulus dielectrics are much less susceptible to mechanical damage during the wire bonding process. The use herein of a low modulus material is a material having a value typically less than eighty GPa (GigaPascals). Additionally, the use herein of a low-k material is a material having a permittivity typically less than four. It should be noted that many of the low-k dielectrics in use have low moduli. The use herein of a high modulus material is a material having a value typically equal to or greater than eighty GPa (GigaPascals).

Interconnect pads are commonly placed in Input/Output (I/O) cells in the IC physical layout. These I/O cells typically contain active and passive devices for the I/O, local interconnect metallization for these I/O devices which are typically routed in lower level metallization layers, and power/ground rails or buses which are typically routed in upper level metallization layers. Power/ground (power) rails are typically quite wide and often placed in multiple metallization layers in order to minimize the resistance of these rails, as required for optimum IC operation. In order to minimize layout area of the I/O cell, it is highly desirable to place circuitry in a vertically aligned stack. For example, the active and passive devices that are in the substrate, the local interconnect metallization, the power buses, and the interconnect pad at the IC surface are placed in a vertical stack. In the most area efficient arrangement, active and passive devices, as well as local interconnect and power rail metallization utilizing all metallization layers, are placed as densely as possible across the physical extent of the I/O cell. However, extreme caution must be taken when placing metallization under the interconnect pad, particularly in copper interconnect/low dielectric modulus technologies, to ensure robust structural support for the pad. Prior solutions for structurally supporting the interconnect pad by placing at least two metal layers under the entire bonding region and connecting these layers to each other and to the bond pad by large arrays of vias do not use layout area efficiently. These solutions prevent use of at least two metal layers under the pad as independent interconnect (i.e. power bus or signal) wires. There is disclosed herein an efficient solution whereby all metal layers under an interconnect pad may be fully or partially utilized for wiring unrelated to the interconnect pad while also providing robust structural support. In other words, no "dummy" metallization or vias, which in prior solutions, serve primarily to provide mechanical support to the pad, are required.

In IC layout design, openings or slots are quite common in each metallization layer. Openings may be placed in the layout in order to physically separate two independent metal wires or shapes. Openings or slots are also commonly placed in wide metal power buses or wires in order to reduce the local metal density in that metal layer. Typically, layout design rules for copper interconnect in an advanced IC process technology require that openings or slots be distributed in a somewhat uniform manner to achieve a target metal density range (i.e. 20%-80%) within a given area. For example, in a layout area with 80% metal density, 80% of the area would contain the metallization while 20% would contain dielectric filled openings (i.e. no metallization). These layout design rules are typically required to ensure planarity of copper metal layers when semiconductor processing known as chemical mechanical polishing (CMP) is utilized. If the metal density within one localized area of the IC is much greater than in an adjacent area, the metal will polish unevenly during CMP, resulting in an undesirable variation in metal layer thickness. Therefore, an array of openings is required in each metal layer, both to define separate metal wires or shapes, and to limit the metal density within an allowed range for CMP process control. However, as will be described later, the presence of openings can have a critical effect on the amount of structural support provided underneath an interconnect pad. Of particular importance is the relative vertical alignment of these openings in certain underlying metal layers.

An important feature of the method and structure disclosed here is the use of vertically aligned openings or slots in two or more of the metallization layers in the interconnect pad region. Typically the uppermost metal layers in contact with low modulus interlevel or intralevel dielectric material require these aligned openings. An interlevel dielectric is defined as the dielectric between two different metal layers. An intralevel dielectric is defined as the dielectric which fills openings or gaps within a single metal layer. The vertically aligned openings of the metal layers in contact with a low modulus dielectric must be present over a predetermined minimum percentage of the interconnect pad area. A good way to visualize the idea of vertically aligned openings is to imagine viewing down through the stack of metallization layers toward the semiconductor substrate. Assuming that metal is opaque and that dielectric is transparent, one would only see through this metal stack where vertically aligned openings are present.

Figure 1:
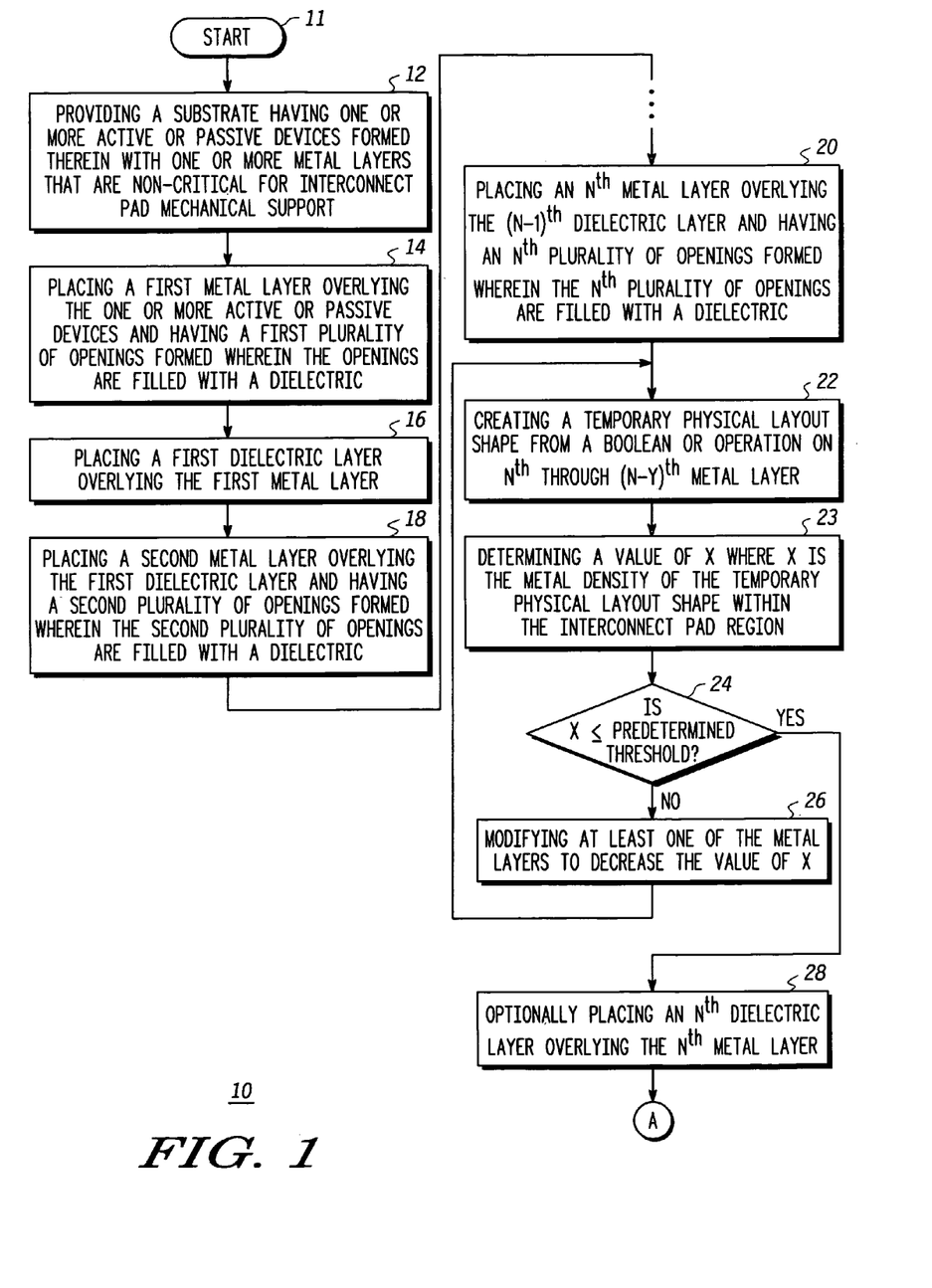
FIGS. 1 and 2 are a flow chart of a layout method for implementing an interconnect pad in accordance with the present invention.
Figure 2:
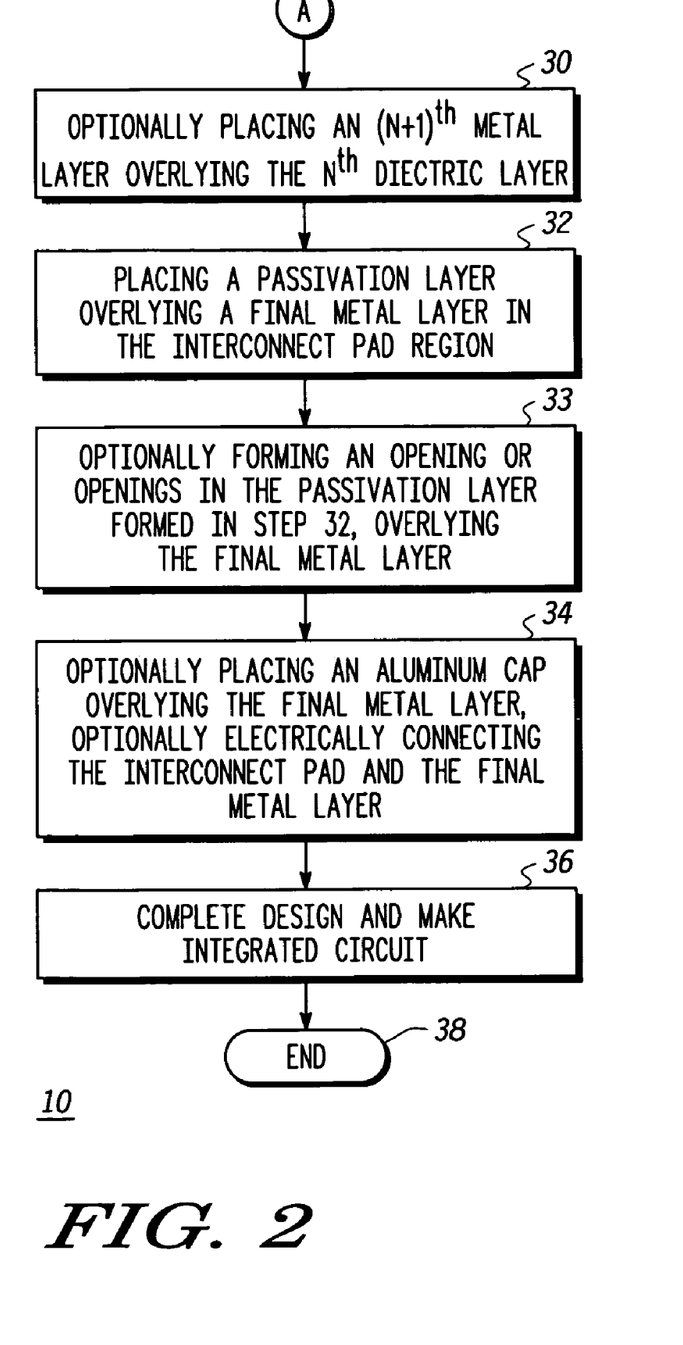

Illustrated in FIGS. 1 and 2 is a method 10 for providing structural support for interconnect pad locations in an integrated circuit (IC) by using layout techniques in the physical layout design to vertically align openings or slots in three or more metallization layers in the interconnect pad region. The flow chart in FIG. 1 and FIG. 2 should be considered a conceptualized design flow, which, for clarity, includes elements of both the physical layout design flow and the IC manufacturing flow. In response to a start command 11, a step 12 is implemented wherein a semiconductor substrate is provided having one or more active or passive devices formed in the substrate. Such active devices may be transistors and diodes, for example, as well as other known active devices. Such passive devices may be resistors, capacitors and inductors as well as other known passive devices. Also in step 12, one or more metal layers are placed which, while important for electrical functionality, are non-critical for (i.e. not being used for the function of) interconnect pad support. In a step 14 a first metal layer is placed overlying the one or more active or passive devices. The first metal layer has a first plurality of openings in the interconnect pad region. Many conventional methods for forming this first metal layer with a plurality of openings may be used. Within the multiple openings of the first metal layer is an intralevel dielectric material. Many conventional methods for forming the intralevel dielectric of the holes of the first metal layer may be used. In a step 16 a first interlevel dielectric layer is placed overlying the first metal layer. Many conventional methods for forming this first interlevel dielectric layer overlying the first metal layer may be used. In a step 18 a second metal layer is placed overlying the first dielectric layer and has a second plurality of openings in the interconnect pad region. The second plurality of openings is filled with an intralevel dielectric.

Prior to a step 20, additional overlying metal layers, each having a plurality of openings filled with an intralevel dielectric and separated by an interlevel dielectric layer may be formed in repetitive steps (not shown in FIG. 1 but indicated by three dots after step 18). In a step 20 an Nth metal layer is placed overlying the (N−1)th dielectric layer.

The Nth metal layer has an Nth plurality of openings formed in the interconnect pad region, where N is an integer. The Nth plurality of openings is filled with an intralevel dielectric. It should be understood that the number of openings in each of the first, second, etc. thru the Nth metal layers may be of a different number and have different shapes and positions. However, the number of openings in each metal layer may also be the same number and many of the shapes or patterns may be the same. In any case, each metal layer must meet the metal density requirements as specified by the layout design rules for the technology.

The Nth metal layer is defined herein as the uppermost metal layer in the interconnect pad structure which is in contact with low modulus dielectric material. The first through Nth plurality of openings are filled, or at least partially filled, with a low modulus intralevel dielectric material. It is understood that the first through (N−1)th interlevel dielectric layers may be a dielectric material of any modulus.

In a step 22, a temporary physical layout shape is created by a Boolean OR operation on the Nth metal layer through the (N−Y)th metal layer. In the illustrated form the uppermost metal layer of the interconnect pad support to be logically ORed is the Nth metal layer, while the lowest metal layer of the interconnect pad support to be logically ORed is the (N−Y)th metal layer. The value Y is an integer that determines the overall number of metal layers below the Nth metal layer for which the layout techniques of method 10 provided herein must be applied. Therefore, the total number of aligned metal layers is equal to Y+1. The number Y may vary depending upon a number of factors including material properties of the metal and dielectric layers and the number of metal layers used in the IC. In the example of method 10, the value Y is greater than or equal to two. In other forms the value Y may be greater than or equal to one.

In a step 23, the metal density of the temporary physical layout shape resulting from the logic OR combination of the Nth through the (N−Y)th metal layers created in step 22 is determined within the physical extent (area) of the interconnect pad region. The value corresponding to this metal density is defined as X. This density value X may also be referred to as the ORed metal density. The ORed metal density is a number equal to or less than unity.

After the ORed metal density value X has been determined, there follows a step 24 in which a comparison is made to determine whether the value X is less than or equal to a predetermined threshold. In one form the predetermined threshold may be any percentage within a range of approximately fifty percent (0.50) to ninety-five percent (0.95). Values for a predetermined threshold include 0.80 and 0.85 but may include any percentage, particularly within the cited range.

If the value X is not less than or equal to the predetermined threshold, a step 26 is implemented in which at least one of the Nth through the (N−Y)th of the metal layers is modified. The modified metal layer may include more openings, resized openings or relocated openings within the interconnect pad region with the goal of yielding a smaller ORed metal density value X. After the replacement with the modified metal layer, steps 22 and 23 are repeated again to determine a new value for X. Step 24 is then also repeated. If the value for X is not yet less than or equal to the predetermined threshold, step 26 is again repeated. This process is repeated in iterative fashion until the value of X is less than or equal to the predetermined threshold. At this point, the temporary physical layout shape may be deleted, since this shape is created only for the purposes of determining the ORed metal density. Therefore, the result of steps 14, 16, 18, 20, 22, 23 and 24 is a physical layout design with vertically aligned openings that are present in the Nth through (N−Y)th metal layers over a fraction X of the total area of the interconnect pad region.

The metal layers between the Nth metal and (N−Y)th metal, inclusive, are defined herein as the aligned metal layers of the interconnect pad structure. Thus the Nth metal layer is the uppermost aligned metal layer of the interconnect pad structure. It should be understood that portions or all of the Nth through (N−Y)th metal layers may be used for wiring or interconnects unrelated to the interconnect pad.

It is assumed that the metal layers of the interconnect pad structure overlying the Nth metal layer, if present, need not be aligned metal layers, because these layers are not in contact with a low modulus interlevel or intralevel dielectric. Traditional high modulus dielectric materials such as is silicon dioxide, silicon oxynitride, or other insulating glass may be used in these layers. The metal layers of the interconnect pad structure underlying the (N−Y)th metal layer may be optionally aligned, but are not required to be aligned, even if in contact with low modulus dielectric materials, to achieve the mechanical support of the interconnect pad.

When the ORed density value of X determined in step 24 is less than or equal to the predetermined threshold one of several options can be chosen to complete the design of the bond pad structure depending on the final desired pad configuration. Three examples of interconnect pad options are described below.

A first example of the application of the method 10 in FIGS. 1 and 2 describes how to complete the bond pad design for a standard interconnect pad structure. In this case an optional step 28, illustrated in FIG. 1, is implemented wherein an Nth dielectric layer is placed overlying the Nth metal layer. This Nth dielectric layer may be a dielectric material of any modulus. In an optional step 30, illustrated in FIG. 2, an (N+1)th metal layer is placed overlying the Nth dielectric layer. In this example, the (N+1)th metal layer is a non-aligned layer and is the final metal layer of the interconnect pad structure. Note that the portion of this metal layer within the interconnect pad region serves as the interconnect pad. In a step 32 a passivation layer is placed over the final metal layer. In this example, a large opening in the passivation layer, corresponding to the full physical extent (area) of the interconnect pad region, is made in a step 33 for the purpose of electrically connecting to the final metal layer.

In a step 34 an aluminum or aluminum alloy layer is optionally placed overlying the interconnect pad. Electrical contact is made from the aluminum cap to the interconnect pad through the large opening in the passivation layer formed in step 33. The aluminum cap is commonly used over copper interconnect pads because of problems with reliably forming wirebonds directly to copper. Therefore a wire bond pad for copper interconnect technologies often utilizes an aluminum layer to cap the exposed wire bond pad.

In a step 36 completion of the physical layout design of the integrated circuit is performed in a conventional and known manner. The method ends at step 38. The interconnect pad structure corresponding to this first example is illustrated in a cross-sectional view in FIG. 4, which is discussed in more detail below.

The method described herein may, for example, be used to form a support structure for an interconnect pad that is not electrically connected to any portion of the Nth through (N−Y)th metal layers within the interconnect pad region. No vias are required for pad support between the pad and the Nth metal layer within the interconnect pad region. In addition, no vias are required for pad support between any of aligned metal layers within the interconnect pad region. Alternately, the interconnect pad may be connected to only portions of the underlying Nth through (N−Y)th metal layers within the interconnect pad region with vias placed only as needed for efficient routing of the interconnect pad signal down to underlying active and passive elements.

Figure 6:
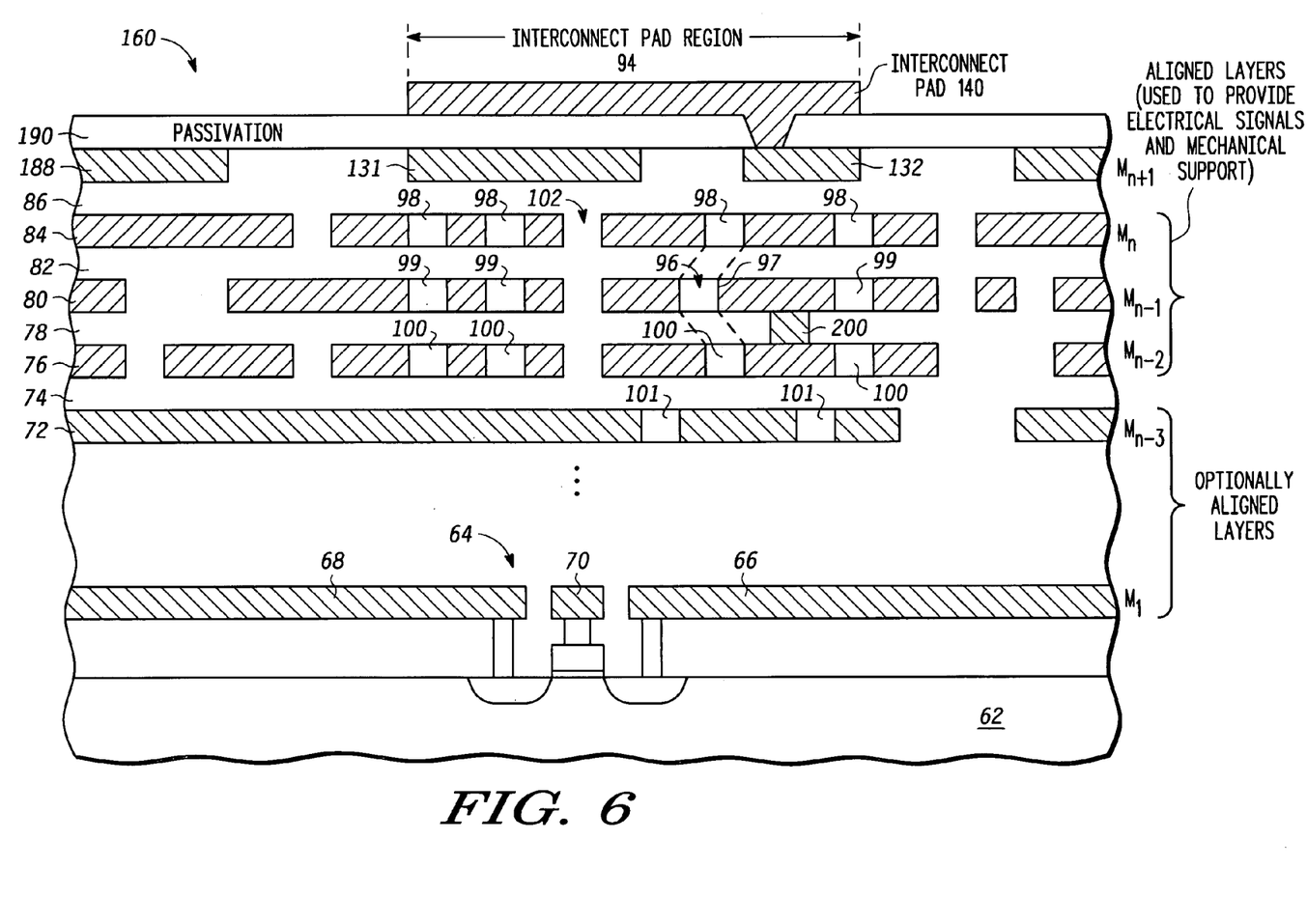
FIG. 6 is a cross section of an interconnect pad region of a portion of a semiconductor in accordance with another form of the present invention.

In a second example of the application of the method 10 of FIGS. 1 and 2, a bond over passivation (BOP) interconnect pad structure may be formed. This example differs from the first in the following respects. As in the first example, the Nth dielectric layer (step 28) and the (N+1)th metal layer (step 30) are placed. As in the prior example, the (N+1)th metal layer is again considered the final metal layer of the interconnect pad structure. After step 30, step 32 is implemented wherein a passivation layer is placed overlying the final metal layer in the interconnect pad region. In step 33, one or more passivation openings are optionally formed which, if present, have a combined area that is typically small relative to the physical extent (area) of the interconnect pad region. The optional openings formed in step 33 provide for electrical connection to portions of the final metal layer.

In a step 34, an aluminum interconnect pad, utilizing the same aluminum cap layer described above, is placed overlying the passivation layer. Electrical contact is optionally made to the final metal layer through one or more openings in the passivation layer formed in step 33. In a step 36 completion of the manufacture of the integrated circuit is performed in a conventional and known manner. Upon completion of the fabrication of the integrated circuit, the method ends at step 38. The interconnect pad structure corresponding to this second example is shown in cross-section in FIG. 6, which is discussed in more detail below.

In a third example of the application of the method 10 in FIGS. 1 and 2, another type of bond over passivation (BOP) interconnect pad structure may be formed. This example differs from the second in that here it is assumed that the final metal layer of the interconnect pad structure is in contact with low modulus dielectric material. To provide robust support for the interconnect pad, it is therefore desirable to include the final metal layer in the group of aligned metal layers. Therefore, in this example, the Nth or uppermost aligned metal layer is also the final metal layer. Therefore, the determination of the ORed metal density in step 22 includes the (N–Y)th metal layer through the final metal layer. As such, the method 10 is carried out as described previously, but step 28 and step 30 are omitted. Thus, a positive result in step 24 leads directly to step 32. The remaining steps 32 through 38 are carried out as described for the second example. The interconnect pad structure corresponding to this third example is shown in cross-section in FIG. 7, which is discussed in more detail below.

Figure 3:
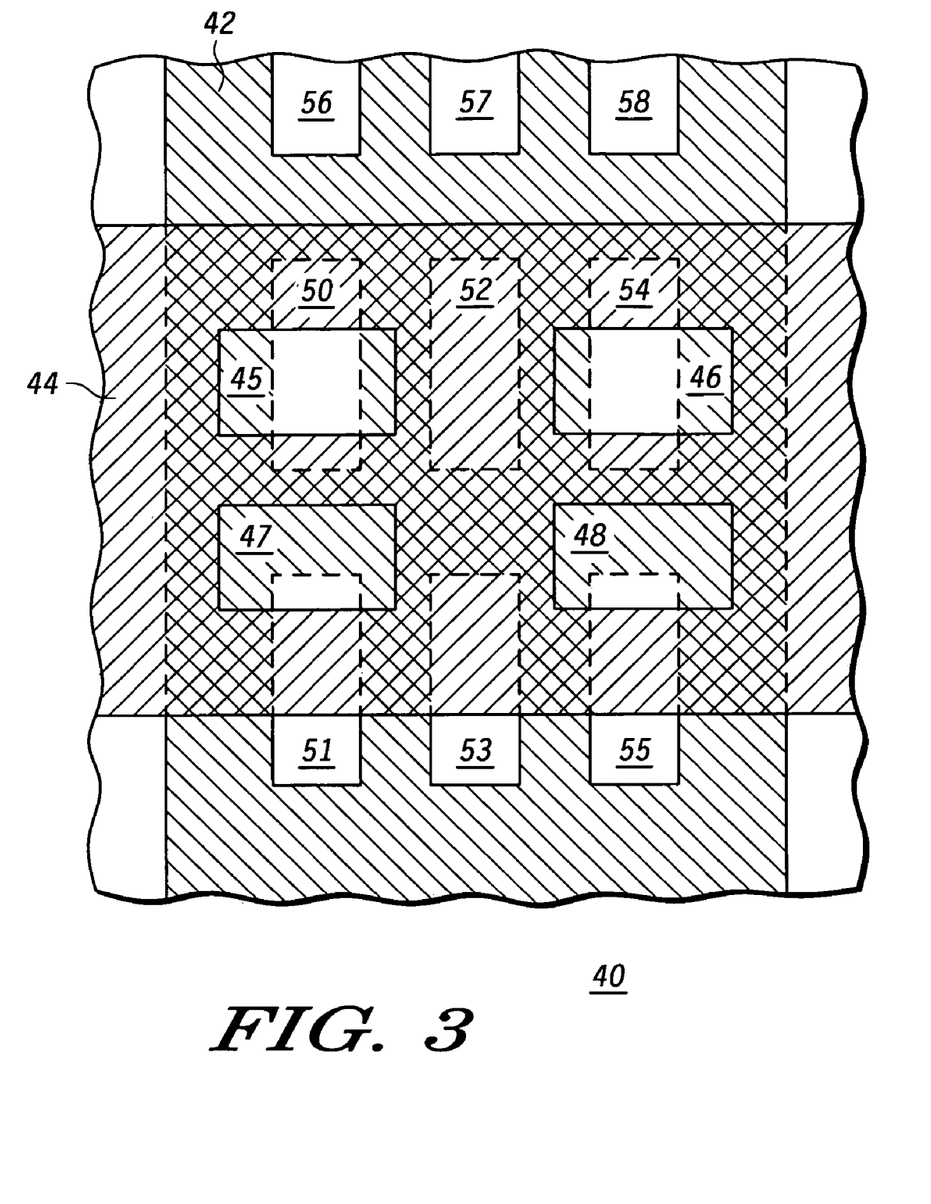
FIG. 3 is a top plan view of a determination associated with the layout method of FIGS. 1 and 2 to implement an interconnect pad having sufficient structural support.

Illustrated in FIG. 3 is a top plan view to help illustrate implementation of the steps 22 through 24 of FIG. 1. Portions of physical layout shapes for two metal layers are shown wherein each metal layer is on a different plane (i.e. one metal layer overlies the other) and are electrically insulated from each other by an iinterlevel dielectric layer. In FIG. 3, the metal layers are drawn with cross-hatched fill lines. Note that the fill lines are orthogonal for each of the two metal layers. Each of the two metal layers has openings or slots illustrated by lack of cross-hatching and some of the openings in one layer partially overlap openings in the other. Each of the openings is filled with an intralevel dielectric. A metal bus 42 in one metal layer is centered about a vertical axis and is underlying a metal bus 44 in the other metal layer that is centered about a horizontal axis. Metal bus 42 and metal bus 44 are perpendicular with each other in the illustrated form but may be angled at any angle to each other. Within metal bus 42 are openings 50-58. Within metal bus 44 are openings 45-48. The openings in each of metal bus 42 and metal bus 44 are spaced apart and arranged in a predetermined pattern. It should be understood that various patterns of openings may be used but are generally distributed across each metal conductor rather than being concentrated only in one portion of each metal conductor.

When the Boolean operation of step 22 is performed, the shape of each of the metal buses 42 and 44 are logically ORed together to create a collective shape that is the total composite shape represented in FIG. 3 by the regions where either one or both types of cross-hatching are present. In step 23 of FIG. 1, the ORed metal density of this collective shape within the interconnect pad region is determined. Portions of metal bus 42 may not be within the interconnect pad region and thus the portions of bus 42 lying outside of the interconnect pad region would not be included in the determination of the value X in step 23. If the result X, representing the ORed metal density, is determined in step 24 to be greater than a predetermined threshold value, then the openings in either metal bus 42 or metal bus 44, or both, may be either moved or resized in order to reduce the ORed density. Alternately additional openings may be placed in one or both metal buses to reduce the ORed density. For example the ORed metal density value may be reduced by better aligning the openings in metal bus 42 with the openings in metal bus 44. In other words, openings 47 and 48 in metal bus 44 may be moved so as to overlie a greater percentage of the underlying openings 51 and 56, respectively. We have found that by ensuring the ORed metal density does not exceed a predetermined percentage or threshold, strong structural support underlying an interconnect pad is provided even when a low modulus dielectric material is used.

Figure 4:
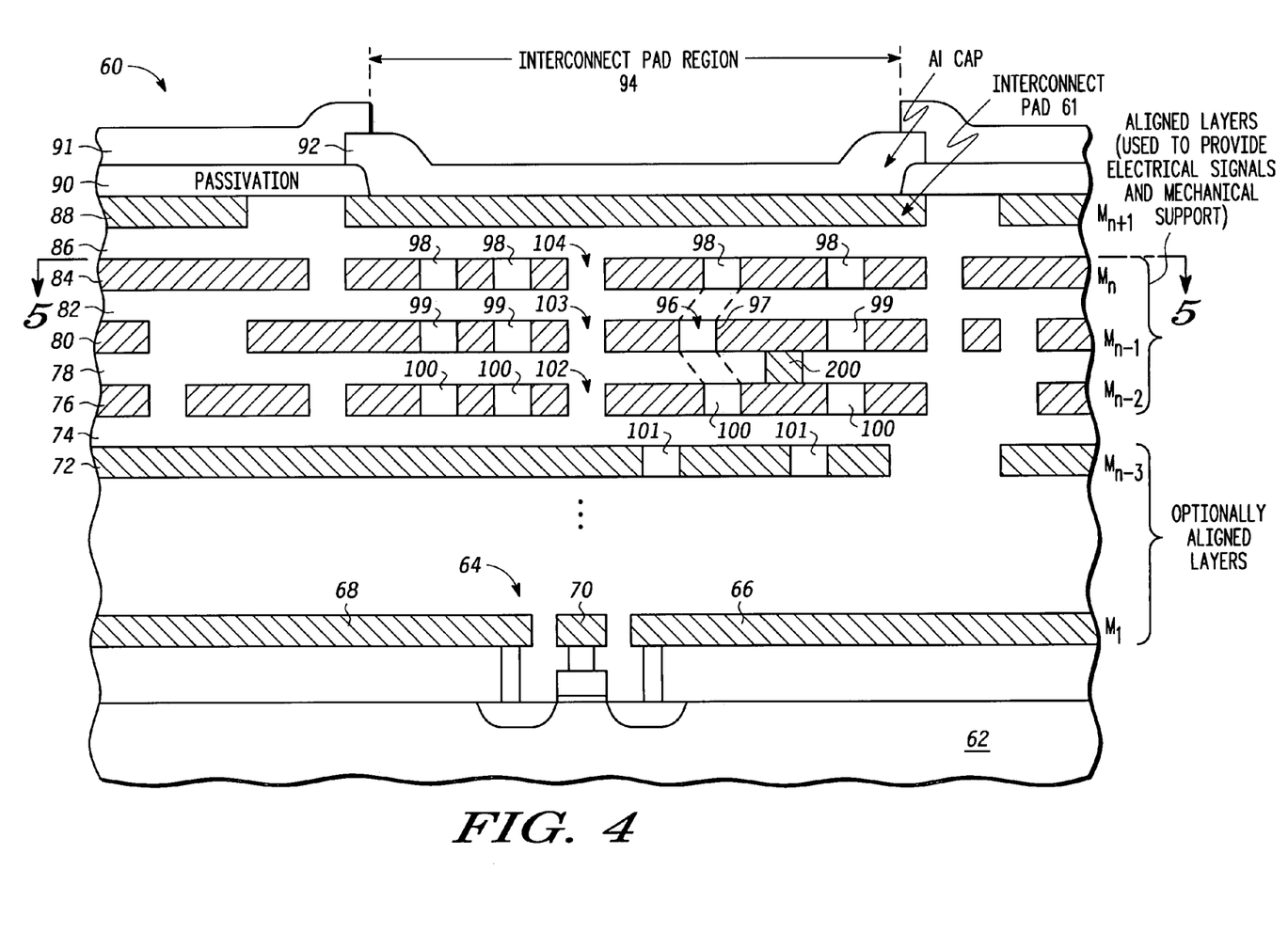
FIG. 4 is a cross section of an interconnect pad region of a portion of a semiconductor in accordance with one form of the present invention.

Illustrated in FIG. 4 is a cross-section of an integrated circuit 60 designed in accordance with the method of FIGS. 1 and 2. The interconnect pad structure illustrated in FIG. 4 corresponds to the first example of interconnect pad structure options provided in the description of FIGS. 1 and 2 where the opening in passivation layer 90, formed in step 33 of FIG. 2 defines the physical extent (area) of the interconnect pad region 94 of the interconnect pad structure. Integrated circuit 60 has an interconnect pad 61 with underlying functional metal interconnect layers and active circuitry. By way of illustration, only a single transistor is illustrated within the substrate 62. It should be understood that other circuitry may be formed in the substrate 62 within the interconnect pad region 94, whether the other circuitry is active circuit devices such as a transistor or diode or passive circuit devices such as resistors, capacitors and inductors. A transistor 64 is formed in substrate 62 having a source, a drain and a gate. A drain contact 66 connects a drain of transistor 64 by a via. A source contact 68 connects a source of transistor 64 by a via. A gate contact 70 connects a gate of transistor 64 by a via. The drain contact 66, the source contact 68, and the gate contact 70 are implemented by using a lowest layer of metal labeled M1. The openings or breaks within metal layer M1 are not required to be vertically aligned with openings in any other metal layer as the metal layer M1 is not used in the determination step 23 of FIG. 1. An optional number of additional layers of metal up to and including a metal layer 72 are provided for electrical interconnect purposes within the integrated circuit. Any additional layers of metal are separated by interlevel dielectric layers. These metal layers, such as metal layer 72, have designed openings, such as openings 101 that are positioned purely based on electrical functional needs and are not considered aligned metal layers using the method of FIGS. 1 and 2. In FIG. 4 the metal layer 72 is designated as an $(M_{n-3})$th metal layer. Overlying metal layer 72 is an interlevel dielectric layer 74. An intralevel dielectric material fills openings 101. A metal layer 76 having openings 100 and 102 and labeled an ($M_{n-2}$)th metal layer overlies dielectric layer 74. An intralevel dielectric material also fills openings 100 and 102. Overlying metal layer 76 is an interlevel dielectric layer 78. A metal layer 80 having openings 96, 99 and 103 and labeled an ($M_{n-1}$)th metal layer overlies dielectric layer 78. A conductive interconnect 200 that electrically connects portions of metal layer 80 to portions of metal layer 76 is provided through dielectric layer 78. This conductive interconnect is commonly referred to as a "via". Vias may be formed of any conductive material but typically a metal such as copper is used. It should be understood that additional (i.e. a plurality) vias, between any of the metal layers shown in FIG. 4, may be implemented as needed for electrical function of the IC. However, it is important to note that no vias are required anywhere in the interconnect pad region for structural support during wire bonding.

Overlying metal layer 80 is an interlevel dielectric layer 82. An intralevel dielectric material fills openings 96, 99 and 103. A metal layer 84 having openings 98 and 104 and labeled an ($M_n$)th metal layer overlies dielectric layer 82. An intralevel dielectric material fills openings 98 and 104. Overlying metal layer 84 is an interlevel dielectric layer 86. In the pad structure of FIG. 4, metal layer 84 is considered the uppermost aligned metal layer. Therefore, openings in metal layers 84, 80 and 76, or the ($M_n$)th, ($M_{n-1}$)th and ($M_{n-2}$)th metal layers must be sufficiently aligned in the physical layout so that the ORed metal density is less than or equal to the predetermined threshold. In another form, only the openings in the ($M_n$)th and ($M_{n-1}$)th metal layers must be sufficiently aligned in the physical layout so that the ORed metal density is less than or equal to the predetermined threshold.

Overlying dielectric layer 86 is a metal layer 88. The portion of metal layer 88 that is within the interconnect pad region 94 in FIG. 4 represents the interconnect pad. Overlying the metal layer 88 is a passivation layer 90 formed of any conventional passivation layer material. An exemplary material for passivation layer 90 is a plasma enhanced nitride or other nitride material. The passivation layer 90 overlying metal layer 88 is selectively etched to expose the interconnect pad portion of metal layer 88.

In one form, the metal layers which underlie the interconnect pad, such as metal layers 76, 80 and 84 are copper or at least contain some copper. In alternate forms, aluminum or aluminum alloys may be used for these metal layers. In one form, the dielectric material of dielectric layer 74, dielectric layer 78 and dielectric layer 82 and the dielectric material in the openings of metal layers 72, 76, 80 and 84 is a low modulus dielectric. In an alternate form, the interlevel dielectric material of dielectric layer 74, dielectric layer 78 and dielectric layer 82 is a high modulus dielectric and the intralevel dielectric material in the openings of metal layers 72, 76, 80 and 84 is a low modulus dielectric. However, in the embodiment of FIG. 4, metal layer 80 and metal layer 84 must be in contact with either a low modulus interlevel dielectric material or a low modulus intralevel dielectric material, or both. The dielectric material in the dielectric layer 86 and the openings of metal layer 88 is a high modulus dielectric such as silicon dioxide, silicon oxynitride, or other insulating glass.

Overlying interconnect pad 61 is an optional aluminum or aluminum alloy cap 92. Electrical contact is made from the aluminum cap 92 to the interconnect pad 61 through the large opening in the passivation layer 90. As described previously, aluminum caps are commonly used over copper interconnect pads because of problems wire bonding directly to copper. Above aluminum cap 92 is formed any of various types of electrical interconnects external to the IC. For example a wire bond (not shown) may be formed on the aluminum cap 92 using materials such as gold wire and solder. In another form, where the metal layer 88 is aluminum, it is possible to form a good bond to the interconnect pad directly without the use of aluminum cap 92. In yet another form a conductive ball (not shown) may be formed on the interconnect pad region 94. Optionally, a second passivation layer 91 may be formed overlying the first passivation layer 90 and the aluminum cap 92. An opening in the second passivation layer 91 is then formed in the interconnect pad region such that the aluminum cap is exposed and available for electrical interconnection by any of the methods described above.

In a typical design, such as that illustrated in FIG. 4, each of the three aligned metal layers in the interconnect pad region are used primarily as wide power/ground buses or wires. As described previously, to ensure chemical mechanical polish (CMP) planarity, layout design rules typically require slots in these wide power buses to reduce the local metal density. In FIG. 4, these slots or openings in a contiguous metal bus are shown with horizontal lines across the opening at the upper and lower edges of the metal layer. For example, openings 98, 99 and 100 are slots in a wide metal bus. In contrast, openings 102, 103 and 104 are not slots in a contiguous bus, but are openings which separate two different metal buses or wires in a single metal layer. This is illustrated by the fact that no horizontal lines are shown across openings 102, 103 and 104 at the upper and lower edges of the metal layer. This is explained more clearly in the top down view of FIG. 5.

Even when utilizing the aligned metal layers in the interconnect pad region primarily for large power buses, it is often difficult to ensure alignment of all the slots or openings in these metal layers. For example, narrow power/ground buses or signal wires must often be routed through this region, interrupting any repetitive alignment of slots and openings. An example misalignment is illustrated in FIG. 4 where the edges of opening 96 of metal layer 80 do not exactly align with the edges of a corresponding overlying opening 98 and a corresponding underlying opening 100. An edge 97 of the misaligned opening 96 is identified for reference later in FIG. 5.

Figure 5:
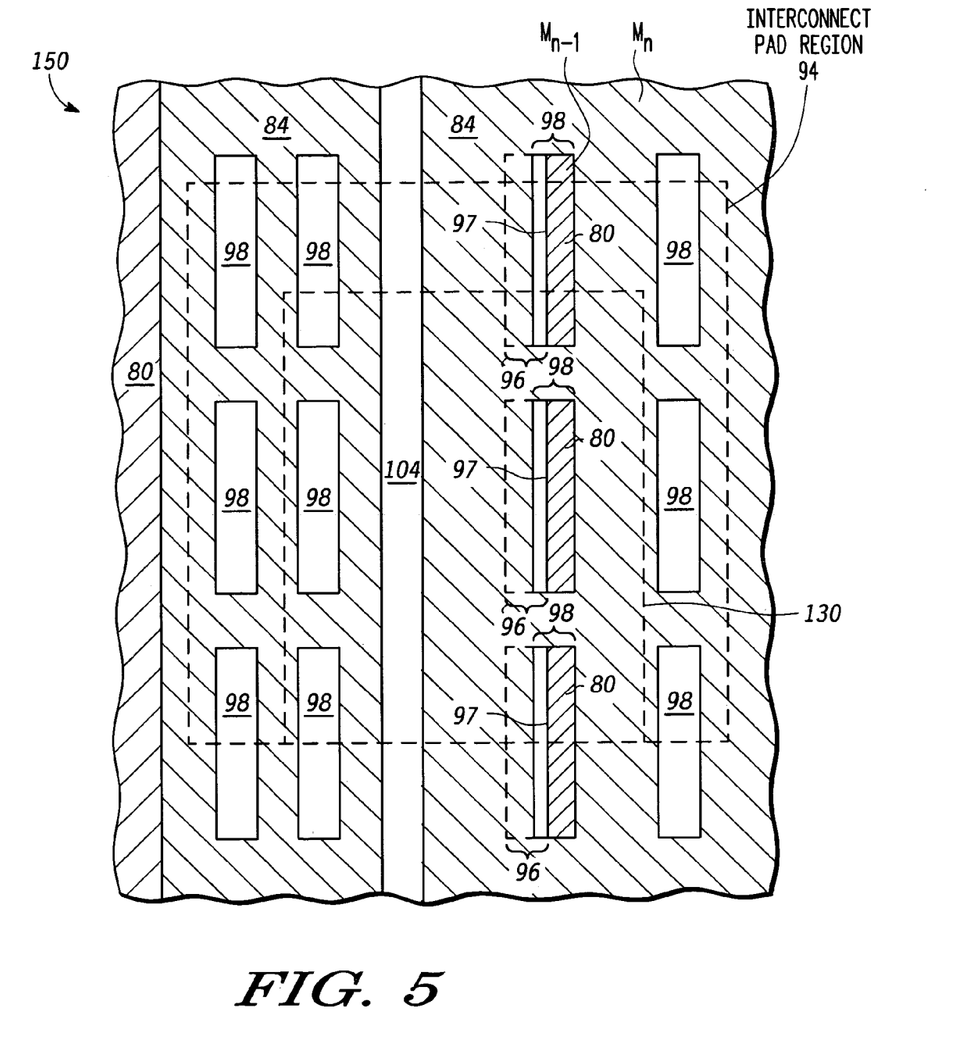
FIG. 5 is a top plan view of two conductive layers of the interconnect pad region of FIG. 4.

To further understand the structure of integrated circuit 60, FIG. 5 illustrates a cross-sectional or top-down view of integrated circuit 60 taken from line 5-5 at an upper edge of metal layer 84 down to the lower edge of metal layer 80. Thus included in the sectional view are metal layer 80 and metal layer 84 as well as the openings 96, 98, and 104 of FIG. 4. The interconnect pad region 94 is outlined with a dashed rectangle. Exposed portions of metal layer 84 are cross-hatched in one direction different from exposed portions of metal layer 80. A total of 12 openings 98 and one opening 104 are shown in metal layer 84. In this example, opening 104 separates two distinct wide power buses, one to the left of opening 104 and one to the right. They may represent, for example, VDD and VSS power supply buses, respectively. Note that openings 98 may serve as slots to reduce the local metal density of metal layer 84 as required by the design rules of the process technology. In a preferred form, the minimum dimension of openings 98, opening 104, and the majority of openings in any aligned metal layer in the interconnect pad region should be in a range from 0.5 micron to 5.0 microns. Typical values for this minimum dimension are 1.0 micron and 1.5 microns.

The misalignment of some openings 98 with openings 96 in FIG. 5 is apparent in that a portion of metal layer 80 is visible in the third column of openings from the left as opposed to the two left-most columns of openings and the right-most column of openings. The edge 97 of the misaligned opening 96 in metal layer 80 is visible through the opening 98 in metal layer 84 and is provided as a reference point between FIG. 4 and FIG. 5. Such misalignment of the openings in the metal layers results in a slight increase in the ORed metal density when the value X is determined in step 23 of method 10 of FIGS. 1 and 2. However, some misalignment of the openings in the metal layers, when required for efficient electrical interconnect design, is acceptable as long as the ORed metal density is equal to or less than the predetermined threshold of step 24 in FIG. 1. If this condition of step 24 is met, the interconnect pad structure will provide structural support for the interconnect pad during the bonding process.

It should again be noted that all or portions of metal layers 76, 80 and 84, under the interconnect pad 61, may be used for wiring or interconnects unrelated to the interconnect pad. This is not possible with prior solutions requiring arrays of vias distributed over the interconnect pad region. In the interconnect pad structure of FIG. 4, it is assumed that no portion of metal layer 84 in the interconnect pad region is used for wiring related to the interconnect pad. This necessarily requires that no vias be placed in dielectric layer 86 within the interconnect pad region to electrically connect interconnect pad 61 to portions of metal layer 84. Therefore, with no metal filled vias present in dielectric layer 86 under the pad, the metal density of this dielectric layer in the interconnect pad region is zero. In FIG. 5, a rectangular region 130 is shown. This region 130 corresponds to the physical extent of a continuous region of interlevel dielectric layer 86, under the interconnect pad 61. Other geometric shapes may be implemented. By definition, no vias are placed within region 130 of dielectric layer 86. Therefore, within region 130, the metal density of dielectric layer 86 is zero. While, in FIG. 5, rectangular region 130 is shown abutting one edge of the interconnect pad region, it may be placed anywhere within the interconnect pad region, and be of varying height and width. However, in a preferred form, rectangular region 130 occupies at least 50% of the interconnect pad region.

Illustrated in FIG. 6 is an integrated circuit 160 with many similarities to integrated circuit 60 of FIG. 4. The interconnect pad structure illustrated in FIG. 6 corresponds to the second example of interconnect pad structure options provided in the description of FIGS. 1 and 2. Here the opening in the passivation layer 190, formed in step 33 of FIG. 2, covers an area significantly less than the interconnect pad region of the interconnect pad structure. Therefore, analogous structural elements will be identically numbered and a repetition of the functional operation of the same elements will not be repeated. Overlying interlevel dielectric layer 86 is a metal layer 188 having various segments that are separated by openings. Within the interconnect pad region 94 the metal layer 188 has metal conductors 131 and 132 separated by an opening. Within the openings of metal layer 188 is an intralevel dielectric. Overlying the metal layer 188 is a passivation layer 190 formed of any conventional passivation layer or insulating layer material. An exemplary material for passivation layer 190 is a plasma enhanced nitride or other nitride material. An opening (not numbered) is formed in the passivation layer 190. In this example, the opening is formed within the interconnect pad region 94. In another example, the opening in the passivation layer 190 may be formed in a portion of the passivation layer 190 that is outside the interconnect pad region. The opening in passivation layer 190 exposes a portion of conductor 132 which is substantially smaller than the area of the interconnect pad region. An aluminum interconnect pad 140 is formed overlying the portion of the passivation layer 190 that defines the interconnect pad region 94 and makes direct physical contact with conductor 132 positioned under the opening formed in the passivation layer 190 within the pad region. During deposition of the aluminum interconnect pad, the aluminum conformally fills the opening in passivation layer 190. In contrast to FIG. 4, where the interconnect pad is formed in metal layer 188 with an optional aluminum cap 92, in FIG. 6 the interconnect pad 140 is formed from the aluminum cap layer. The resulting structure therefore provides a bond over passivation (BOP) structure when a wire bond (not shown) is formed on the interconnect pad 140. This BOP pad structure has an advantage over the standard pad structure of FIG. 4 in that portions of metal layer 188, under the interconnect pad 140, are now free for use as wiring unrelated to the interconnect pad. For example, conductor 131 is assumed unrelated to the interconnect pad. In FIG. 6, the dielectric material of dielectric layer 86 and the dielectric material in the openings in metal layer 188 are assumed to be a high modulus dielectric. Further it is assumed that metal layers 76, 80 and 84 are in contact with low modulus dielectric materials. Therefore, in the pad structure of FIG. 6, metal layer 84 is considered the uppermost aligned metal layer. Openings in metal layers 84, 80 and 76, or the $(M_n)$th, $(M_{n-1})$th and $(M_{n-2})$th metal layers must be sufficiently aligned in the physical layout so that the ORed metal density is less than or equal to the predetermined threshold. In another form, only the openings in the $(M_n)$th and $(M_{n-1})$th metal layers must be sufficiently aligned in the physical layout so that the ORed metal density is less than or equal to the predetermined threshold.

In another form of this example, no opening is formed in the passivation layer 190 and, therefore, no electrical connection is made between the interconnect pad 140 and the metal conductor 132 of metal layer 188. This form of BOP pad structure might be used in an IC design where the interconnect pad is electrically connected to metal underlying the passivation in a location remote from the interconnect pad region.

Figure 7:
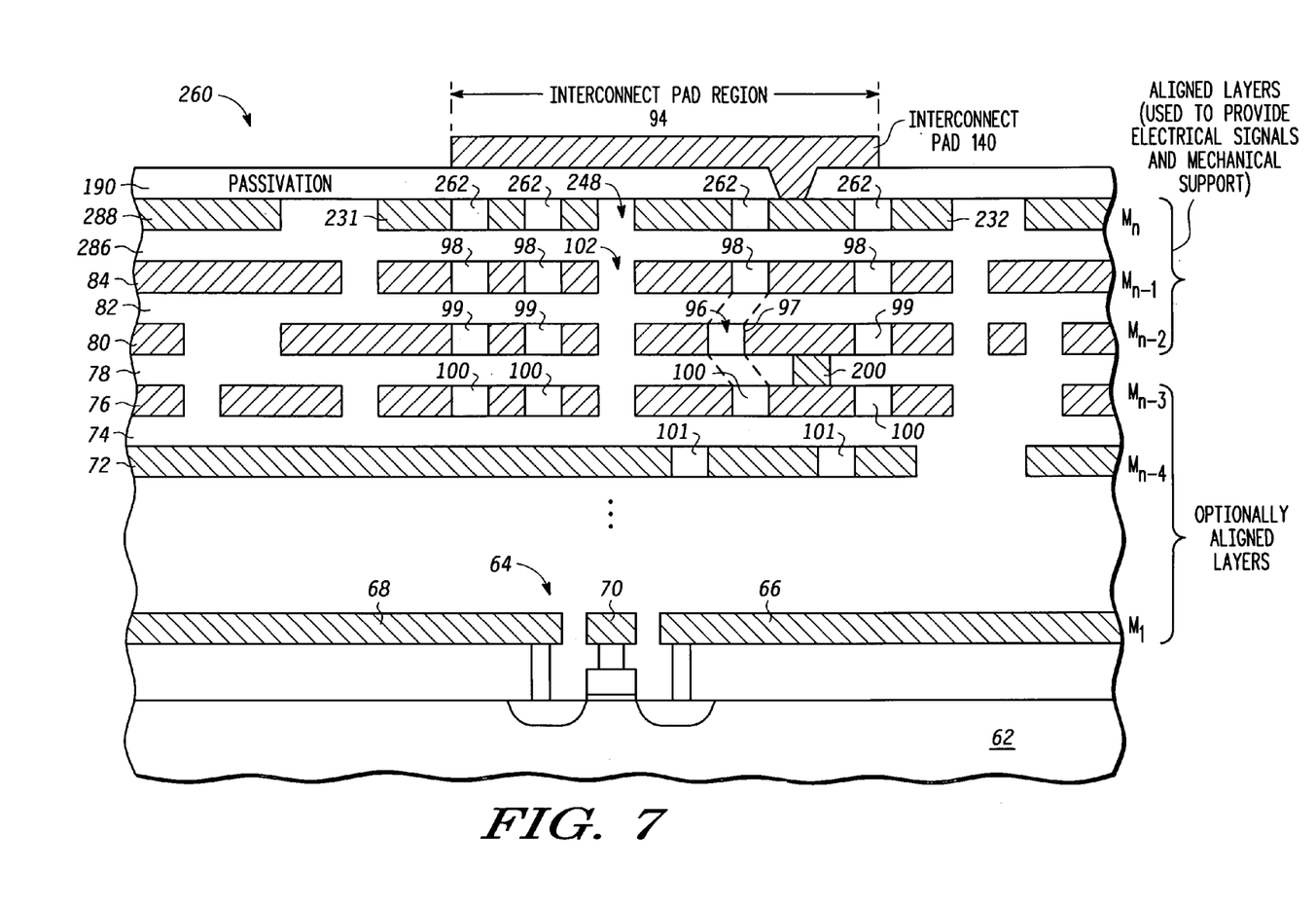
FIG. 7 is a cross section of an interconnect pad region of a portion of a semiconductor in accordance with yet another form of the present invention.

Illustrated in FIG. 7 is an interconnect pad structure that corresponds to the third example of interconnect pad structure options provided in the method of FIGS. 1 and 2. FIG. 7 illustrates an integrated circuit 260 with many similarities to integrated circuit 160 of FIG. 6. Therefore, analogous structural elements will be identically numbered and a repetition of the functional operation of the same elements will not be repeated. In contrast to the interconnect pad structure of FIG. 6, the interconnect pad structure of FIG. 7 features a final metal layer 288 in contact with a low modulus dielectric material. In order to support the aluminum interconnect pad 140, the final metal layer 288 is thus required to be an aligned layer. In accordance with the definition of the Nth metal layer as the uppermost aligned metal layer, the final metal layer 288 is labeled as the $M_n$th layer and is considered in the determination of the ORed metal density of steps 22 and 23 in method 10 of FIGS. 1 and 2. The corresponding metal layers 84 and 80 underlying metal layer 288 are also aligned layers in this example. Metal layer 76 is optionally aligned with the overlying metal layers 288, 84 and 80. Therefore, metal layer 76 would not be included in the determination of the ORed metal density of steps 22 and 23 of FIG. 1. The labels for the metal layers of the interconnect pad structure are indexed from the Nth metal layer such that metal layer 84 is the $M_{(n-1)}$th metal layer, metal layer 80 is the $M_{(n-2)}$th metal layer, and metal layer 76 is the $M_{(n-3)}$th metal layer. Functionally, the metal layers 84, 80, and 76 are analogous to the same layers in FIG. 6. Overlying metal layer 84 is an interlevel dielectric layer 286. Overlying dielectric layer 286 is a metal layer 288 having various segments that are separated by openings. An intraleval dielectric material fills openings 104 in the segments of the metal layer 288. In this example, either the dielectric material of dielectric layer 286 is a low modulus dielectric or the dielectric which fills openings 104 is a low modulus dielectric material, or both. In any case, metal layer 288 is in contact with low modulus dielectric material.

Overlying dielectric layer 286 in FIG. 7 is a metal layer 288 having various segments that are separated by openings. Within the interconnect pad region 94 the metal layer 288 has metal conductors 231 and 232 separated by an opening 240. Conductor 231 and conductor 232 may each be considered wide contiguous buses or wires with multiple openings or slots 262. Within all openings and slots of metal layer 288 is an intralevel dielectric. Overlying the metal layer 288 is a passivation layer 190 formed of any conventional passivation layer material. An exemplary material for passivation layer 190 is a plasma enhanced nitride or other nitride material. An opening (not numbered) is formed in the passivation layer 190. In this example, the opening is formed within the interconnect pad region 94. In another example, the opening in the passivation layer 190 may be formed in a portion of the passivation layer 190 that is outside the interconnect pad region. The opening in passivation layer 190 exposes a portion of conductor 232 which is substantially smaller than the area of the interconnect pad region. An aluminum interconnect pad 140 is formed overlying the portion of the passivation layer 190 that defines the interconnect pad region 94 and makes direct physical contact with conductor 232 positioned under the opening formed in the passivation layer 190 within the pad region. During deposition of the aluminum interconnect pad, the aluminum conformally fills the opening in passivation layer 190. The resulting structure therefore provides a bond over passivation (BOP) structure when a wire bond (not shown) is formed on the interconnect pad 140. This BOP pad structure has an advantage over the standard pad structure of FIG. 4 in that portions of metal layer 288, under the interconnect pad 140, are now free for use as wiring unrelated to the interconnect pad. For example, conductor 231 is assumed unrelated to the interconnect pad.

In another form of this example, no opening is formed in the passivation layer 190 and, therefore, no electrical connection is made between the interconnect pad 140 and the metal conductor 232 of metal layer 288. This form of BOP pad structure might be used in an IC design where the interconnect pad is electrically connected to metal underlying the passivation in a location remote from the interconnect pad region.

Thus, in the examples of FIGS. 4, 6 and 7, the integrated circuits 60, 160 and 260 have multiple aligned metal layers underlying the interconnect pad that are used to provide electrical signals and mechanical support for the interconnect pad. Even though a low modulus dielectric material is used in the layers of the interconnect pad structure, there is sufficient support provided to withstand the compressive forces applied to the interconnect pad structure when a wirebond is formed on the interconnect pads 40 and 140. Additionally, there is sufficient mechanical strength to withstand the upward tensile force applied to the interconnect pad as the wirebonding capillary is pulled away from the interconnect pads 40 and 140 and the wirebonding wire is tensioned. Similar compressive forces exist when other interconnects such as conductive bumps are used. As a result of the mechanical reinforcement of the interconnect pad structure by the alignment of the metal layers by the method described in FIGS. 1 and 2, it is not required to place vias, plugs or other "dummy" metal supporting elements between underlying metal layers. The placement of such vias, plugs, and other metal supporting elements make the underlying metal layers all electrically connected. The interconnect pad structures resulting from the method of FIGS. 1 and 2 allow placement of separate power, ground, electrostatic discharge (ESD) and signal lines, as well as active silicon devices and local interconnect in the region underlying the interconnect pad.

By now it should be appreciated that there has been provided an interconnect pad structure that enables the use of active circuitry under interconnect pads that have underlying metal layers separated by low modulus dielectric materials. Metal layers using copper are particularly effective in structural support when using the alignment method described herein. However, other metals may be used to implement the supportive structure described herein. The structure provided herein permits the assembly of products incorporating low modulus dielectrics to be carried out using low cost wirebond assembly equipment. Such low modulus dielectrics include many low-k dielectric materials.

In one form there is provided a method for providing structural support for an interconnect pad. A substrate is provided. A first metal layer is provided overlying the substrate, the first metal layer having a plurality of openings. A first electrically insulating layer overlying the first metal layer is provided. A second metal layer overlying the first electrically insulating layer is provided, the second metal layer having a plurality of openings. An interconnect pad overlying the second metal layer is provided, the interconnect pad defining an interconnect pad area. A physical layout shape is created from a logic operation on the first metal layer and the second metal layer. A value X which is a metal density of the physical layout shape within a region of the interconnect pad is determined. The value X is used to determine if sufficient alignment of the plurality of openings of the first metal layer and the plurality of openings of the second metal layer exist for sufficient structural support.

In one form the value X is required to be less than or equal to a predetermined threshold. In another form the predetermined threshold comprises 0.85. In yet another form the predetermined threshold comprises a range from 0.80 to 0.85, inclusive. In yet another form the predetermined threshold comprises a range from 0.70 to 0.95, inclusive. In another form a second electrically insulating layer is provided overlying the second metal layer. In another form a third metal layer is interposed between the second electrically insulating layer and the interconnect pad, the third metal layer having a plurality of openings. In yet another form the first electrically insulating layer and the second electrically insulating layer comprise a same material. In yet another form the first electrically insulating layer comprises a dielectric. In another form the first electrically insulating layer has a permittivity less than 4. In one form the first electrically insulating layer has a modulus value less than 80 gigaPascals. In another form the plurality of openings in the first metal layer and the plurality of openings in the second metal layer are substantially filled with the first electrically insulating layer. In another form the first metal layer and the second metal layer respectively have a physical metal density in a range of 20-80% for respective areas of the first metal layer and the second metal layer. In another form one or more vias are formed through the first electrically insulating layer to electrically connect at least a portion of the first metal layer to at least a portion of the second metal layer. In another form a passivation layer is interposed between the interconnect pad and the second metal layer. In yet another form at least one device is formed in the substrate underlying the interconnect pad. In another form an interconnect pad structure is formed within an interconnect pad region. A substrate having semiconductor devices is formed therein. A plurality of conductive layers is provided, each overlying the substrate within the interconnect pad region and in contact with one or more low modulus dielectric material(s). The plurality of conductive layers is formed with vertically aligned openings over a predetermined portion of the interconnect pad region sufficient to provide mechanical support for the interconnect pad structure. In another form the interconnect pad structure further comprises a dielectric layer overlying an uppermost of the plurality of conductive layers. The dielectric layer comprises a region with no metal density within the region of the dielectric layer thereby having no metal passing through any opening of the dielectric layer, the region occupying at least fifty percent of the interconnect pad region. A conductive interconnect pad layer overlies the dielectric layer.

In yet another form there is provided an interconnect pad structure formed within an interconnect pad region. A substrate with active circuitry functionally using the substrate is provided. A plurality of metal interconnect layers overlie the substrate, the plurality of metal interconnect layers being in contact with one or more low modulus dielectric materials and formed with vertically aligned openings within a predetermined portion of the interconnect pad region. An uppermost metal interconnect layer overlies the plurality of metal interconnect layers. An insulating layer overlies the uppermost metal interconnect layer and has one or more openings to expose a first electrical conductor of the uppermost metal interconnect layer. A conductive pad is formed overlying the insulating layer and is connected to the first electrical conductor by filling the one or more openings. A second electrical conductor of the uppermost metal interconnect layer is electrically isolated from the conductive pad only by the insulating layer and the second electrical conductor is not directly connected to the conductive pad. The first electrical conductor and the second electrical conductor are separated by a dielectric material having a modulus greater than that of the one or more low modulus dielectric materials.

In another form an opening in the uppermost metal interconnect layer that separates the first electrical conductor of the uppermost metal interconnect layer from the second electrical conductor of the uppermost metal interconnect layer is not fully aligned with the vertically aligned openings of the plurality of metal interconnect layers.

In yet another form there is provided an interconnect pad structure within an interconnect pad region. A substrate has active circuitry. A plurality of metal interconnect layers overlies the substrate, each of the plurality of metal interconnect layers being in contact with one or more low modulus dielectric materials and formed with vertically aligned openings within a predetermined portion of the interconnect pad region. An insulating layer overlies the plurality of metal interconnect layers. A metal pad is formed overlying the insulating layer and is connected to a first electrical conductor of an uppermost one of the plurality of metal interconnect layers by filling one or more openings in the insulating layer. A second electrical conductor of the uppermost one of the plurality of metal interconnect layers is electrically isolated from the metal pad only by the insulating layer. The second electrical conductor is not directly connected to the metal pad.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as "comprising" (i.e., open language). The term "coupled", as used herein, is defined as connected, although not necessarily directly, and not necessarily mechanically.

What is claimed is:

1. A method for providing structural support for an interconnect pad, the method comprising:
   providing a substrate;
   providing a first metal layer overlying the substrate, the first metal layer having a plurality of openings;
   providing a first electrically insulating layer overlying the first metal layer;
   providing a second metal layer overlying the first electrically insulating layer, the second metal layer having a plurality of openings;
   providing an interconnect pad overlying the second metal layer, the interconnect pad defining an interconnect pad area;
   creating a physical layout shape from a logic operation on the first metal layer and the second metal layer;
   determining a value X which is a metal density of the physical layout shape within a region of the interconnect pad; and
   using the value X to determine if sufficient alignment of the plurality of openings of the first metal layer and the plurality of openings of the second metal layer exist for sufficient structural support.

2. The method of claim 1, further comprising:
   requiring the value X to be less than or equal to a predetermined threshold.

3. The method of claim 2 wherein the predetermined threshold comprises 0.85.

4. The method of claim 2 wherein the predetermined threshold comprises a range from 0.80 to 0.85, inclusive.

5. The method of claim 2 wherein the predetermined threshold comprises a range from 0.70 to 0.95, inclusive.

6. The method of claim 1, further comprising:
providing a second electrically insulating layer overlying the second metal layer; and
providing a third metal layer interposed between the second electrically insulating layer and the interconnect pad, the third metal layer having a plurality of openings.

7. The method of claim 6 wherein the first electrically insulating layer and the second electrically insulating layer comprise a same material.

8. The method of claim 1 wherein the first electrically insulating layer comprises a dielectric.

9. The method of claim 1 wherein the first electrically insulating layer has a permittivity less than 4.

10. The method of claim 1, wherein the first electrically insulating layer has a modulus value less than 80 gigaPascals.

11. The method of claim 1, wherein the plurality of openings in the first metal layer and the plurality of openings in the second metal layer are substantially filled with the first electrically insulating layer.

12. The method of claim 1, wherein the first metal layer and the second metal layer respectively have a physical metal density in a range of 20-80% for respective areas of the first metal layer and the second metal layer.

13. The method of claim 1, further comprising:
providing one or more vias through the first electrically insulating layer to electrically connect at least a portion of the first metal layer to at least a portion of the second metal layer.

14. The method of claim 1, further comprising:
providing a passivation layer interposed between the interconnect pad and the second metal layer.

15. The method of claim 1 wherein at least one device is formed in the substrate underlying the interconnect pad.

16. A method for providing structural support for an interconnect pad, the method comprising:
providing a substrate;
providing a first conductive layer overlying the substrate, the first conductive layer having a plurality of openings;
providing a first electrically insulating layer overlying the first conductive layer;
providing a second conductive layer overlying the first electrically insulating layer, the second conductive layer having a plurality of openings;
providing an interconnect pad overlying the second conductive layer, the interconnect pad defining an interconnect pad area;
creating a physical layout shape from a logic operation on the first conductive layer and the second conductive layer;
determining a value X which is a density of the physical layout shape within a region of the interconnect pad; and
using the value X to determine if sufficient alignment of the plurality of openings of the first conductive layer and the plurality of openings of the second conductive layer exist for sufficient structural support.

17. The method of claim 16 further comprising:
providing a second electrically insulating layer overlying the second conductive layer; and
providing a third conductive layer interposed between the second electrically insulating layer and the interconnect pad, the third conductive layer having a plurality of openings.

18. The method of claim 16 further comprising:
providing one or more vias through the first electrically insulating layer to electrically connect at least a portion of the first conductive layer to at least a portion of the second conductive layer.

19. The method of claim 16 further comprising:
providing a passivation layer interposed between the interconnect pad and the second conductive layer.

20. A method for providing structural support for an interconnect pad, the method comprising:
providing a substrate having one or more active or passive devices formed therein;
providing a first conductive layer overlying the substrate, the first conductive layer having a plurality of openings;
providing a first electrically insulating layer overlying the first conductive layer;
providing a second conductive layer overlying the first electrically insulating layer, the second conductive layer having a plurality of openings;
providing an interconnect pad overlying the second conductive layer, the interconnect pad defining an interconnect pad area;
creating a physical layout shape from a Boolean OR operation on the first conductive layer and the second conductive layer;
determining a value X which is a density of the physical layout shape within a region of the interconnect pad; and
using the value X to determine if sufficient alignment of the plurality of openings of the first conductive layer and the plurality of openings of the second conductive layer exist for sufficient structural support.

* * * * *